(12) United States Patent
Ho et al.

(10) Patent No.: US 11,469,705 B2
(45) Date of Patent: Oct. 11, 2022

(54) LINEAR MOTOR WITH HEAT DISSIPATING CAPABILITIES AND HEAT REDUCING CONSIDERATIONS

(71) Applicant: PBA SYSTEMS PTE LTD., Singapore (SG)

(72) Inventors: Choon Wan Ho, Singapore (SG); Thennakoon Suranjith, Singapore (SG); Nasser Isa, Singapore (SG)

(73) Assignee: PBA SYSTEMS PTE LTD., Singapore (SG)

( * ) Notice: Subject to any disclaimer, the term of this patent is extended or adjusted under 35 U.S.C. 154(b) by 126 days.

(21) Appl. No.: 16/761,282

(22) PCT Filed: Oct. 31, 2018

(86) PCT No.: PCT/SG2018/050550
§ 371 (c)(1),
(2) Date: May 4, 2020

(87) PCT Pub. No.: WO2019/088924
PCT Pub. Date: May 9, 2019

(65) Prior Publication Data
US 2020/0287501 A1    Sep. 10, 2020

(30) Foreign Application Priority Data
Nov. 6, 2017    (SG) ............................ 10201709114V

(51) Int. Cl.
*H02P 29/64*    (2016.01)
*H02K 11/215*    (2016.01)
(Continued)

(52) U.S. Cl.
CPC .............. *H02P 29/64* (2016.02); *H01L 35/30* (2013.01); *H02K 9/22* (2013.01); *H02K 11/215* (2016.01);
(Continued)

(58) Field of Classification Search
CPC ..... H02P 29/64; H02P 25/064; H02K 11/215; H02K 11/22; H02K 9/22; H02K 41/031; H01L 35/30
See application file for complete search history.

(56) References Cited

U.S. PATENT DOCUMENTS 5,047,676 A    9/1991  Ichikawa
6,300,691 B1  10/2001  Hwang et al.
(Continued)

FOREIGN PATENT DOCUMENTS

GB         2531260 A      4/2016

OTHER PUBLICATIONS

International Search Report and Written Opinion [PCT/SG2018/050550] ISA/AU dated Jan. 4, 2019.

*Primary Examiner* — Zoheb S Imtiaz
(74) *Attorney, Agent, or Firm* — Daniel J. Chalker; Edwin S. Flores; Chalker Flores, LLP

(57) ABSTRACT

A linear motor is disclosed, the linear motor comprising a longitudinal coil assembly comprising coil units arranged in a cascading manner and a magnet track spaced from the coil assembly, and adapted to move along a path which traces a periphery of the coil assembly. The linear motor further comprises sensors, each sensor being associated with a subset of the coil units, and adapted to send a first sensor signal in response to detecting the magnet track. The linear motor further comprises a control unit, wherein the control unit is configured to receive the first sensor signal, identify the sensor which sent the first sensor signal, and power up the subset of the coil units associated with the sensor.

8 Claims, 11 Drawing Sheets

(51) Int. Cl.
*H02K 11/22* (2016.01)
*H02P 25/064* (2016.01)
*H01L 35/30* (2006.01)
*H02K 9/22* (2006.01)
*H02K 41/03* (2006.01)

(52) U.S. Cl.
CPC ........... *H02K 11/22* (2016.01); *H02K 41/031* (2013.01); *H02P 25/064* (2016.02)

(56) References Cited

U.S. PATENT DOCUMENTS

| | | | |
|---|---|---|---|
| 6,597,544 B2 | 7/2003 | Ghoshal | |
| 6,952,086 B1 | 10/2005 | Krefta et al. | |
| 7,362,003 B2 | 4/2008 | Stewart et al. | |
| 7,937,952 B2 | 5/2011 | Johnson | |
| 2008/0274897 A1* | 11/2008 | Wiezoreck | H02K 41/02 310/12.29 |
| 2010/0253930 A1* | 10/2010 | Ito | G03F 7/70758 310/12.05 |
| 2011/0025138 A1* | 2/2011 | Chao | H02K 41/03 310/12.29 |
| 2015/0061416 A1* | 3/2015 | Kainuma | H02K 9/22 310/12.18 |
| 2019/0077608 A1* | 3/2019 | Huang | B65G 43/06 |

* cited by examiner

LINEAR MOTOR WITH HEAT DISSIPATING CAPABILITIES AND HEAT REDUCING CONSIDERATIONS

CROSS-REFERENCE TO RELATED APPLICATIONS

This application is the National Stage of International Application No. PCT/SG2018/050550, filed on Oct. 31, 2018, which claims priority to SG 10201709114V, filed on Nov. 6, 2017, the contents of each of which is hereby incorporated by reference in their entirety.

FIELD OF THE INVENTION

The following discloses a linear motor, and more particularly a linear motor with heat dissipating capabilities and heat reducing considerations.

BACKGROUND

When current is supplied to a linear motor, a linear trust is produced which results in either the motion of the magnet track or the coil assembly, which cause heat to be generated. To address the overheating, U.S. Pat. No. 6,528,907 B2 teaches a linear motor having thermo-electric semiconductor cooling modules to dissipate heat from the stator element.

However, this solution is inefficient as it requires the continuous powering of the thermoelectric semiconductor cooling modules along the length of the stator element. This inefficiency is compounded when the length of the motor coil is long. Furthermore, this solution is ineffective when the heat generation is in specific areas.

The present invention therefore seeks to provide a linear motor with the capability to selectively cool portions of its coil assembly. Furthermore, another object of the invention is to selectively power up portions of the coil assembly, with the aim of reducing the overall heat being generated by the linear motor. Other desirable features and characteristics will become apparent from the subsequent detailed description and the appended claims, taken in conjunction with the accompanying drawings and this background of the disclosure.

SUMMARY OF INVENTION

According to a first aspect of the invention, a linear motor is disclosed, the linear motor comprising a longitudinal coil assembly comprising a plurality of coil units arranged in a cascading manner and a magnet track spaced from the coil assembly, and adapted to move along a path which traces a periphery of the coil assembly. The linear motor further comprises a plurality of sensors, each sensor in the plurality of sensors being associated with a subset of the plurality of coil units, and adapted to send a first sensor signal in response to detecting the magnet track. The linear motor further comprises a control unit, wherein the control unit is configured to receive the first sensor signal, identify the sensor in the plurality of sensors, the sensor having sent the first sensor signal, and power up the subset of the coil units associated with the sensor.

Preferably, the linear motor further comprises a plurality of thermo-electric cooling units and wherein each sensor in the plurality of sensors are further associated with a subset of the plurality of thermo-electric cooling units, and wherein the control unit is further configured to identify another sensor in the plurality of sensors, the another sensor having sent the first sensor signal, and activate the subset of the plurality of thermo-electric cooling units associated with the another sensor.

Preferably, the subset of the plurality of thermo-electric cooling units associated with the another sensor are positioned adjacent to, and are adapted to cool the subset of the plurality of coil units associated with the sensor.

Preferably, the subset of the plurality of coil units associated with the sensor comprises a "U" coil winding, a "V" coil winding and a "W" coil winding, and wherein the subset of the plurality of thermo-electric cooling units associated with the another sensor are adapted to cool the "U" coil winding, the "V" coil winding, and the "W" coil winding.

Preferably, each sensor in the plurality of sensors is further adapted to send a second sensor signal in response to not detecting the magnet track, and wherein the control unit is further configured to receive the second sensor signal from the sensor and depower the subset of the plurality of coil units associated with the sensor.

Preferably, the control unit is further configured to receive the second sensor signal from the another sensor and deactivate the subset of the plurality of thermo-electric cooling units associated with the another sensor.

Preferably, the sensor and the another sensor are the same sensor.

Preferably, the plurality of sensors comprises hall sensors adapted to detect a magnetic field of the magnet track or optical sensors adapted to detect a position of the magnet track.

Preferably, the linear motor further comprises a coil assembly cap and wherein the plurality of thermo-electric cooling units are embedded in the coil assembly cap.

Preferably, the linear motor further comprises a heat sink positioned adjacent to the plurality of thermo-electric cooling units

BRIEF DESCRIPTION OF THE DRAWINGS

The accompanying figures, where like reference numerals refer to identical or functionally similar elements throughout the separate views and which together with the detailed description below are incorporated in and form part of the specification, serve to illustrate various embodiments, by way of example only, and to explain various principles and advantages in accordance with a present embodiment.

DETAILED DESCRIPTION

Figure 1:
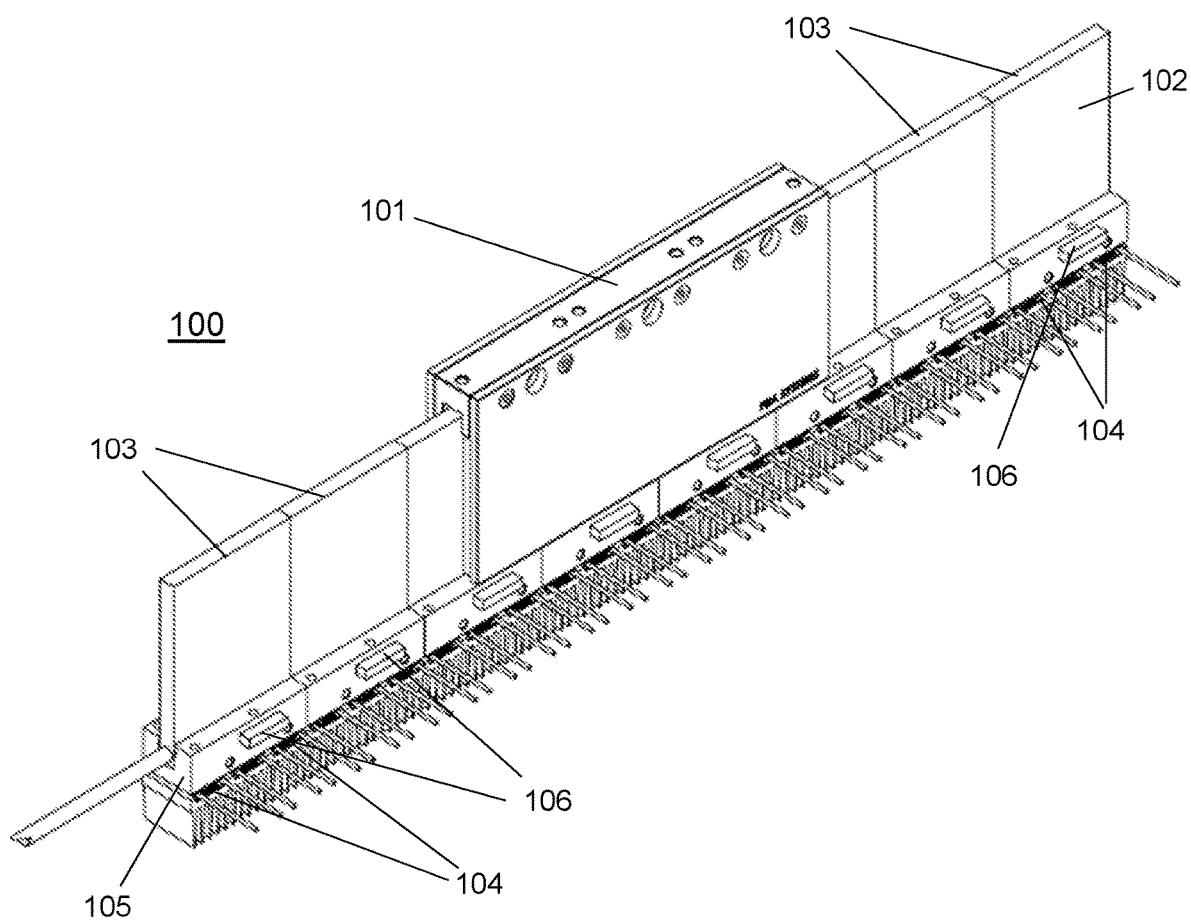
FIG. 1 shows a perspective view of a linear motor according to an embodiment of the invention.

The following detailed description is merely exemplary in nature and is not intended to limit the invention or the application and uses of the invention. Furthermore, there is no intention to be bound by any theory presented in the preceding background of the invention or the following detailed description.

In embodiments, a linear motor is described, the linear motor comprising a longitudinal coil assembly. The coil assembly comprises coil units arranged in a cascading manner. The linear motor also comprises a magnet track spaced from the coil assembly, and adapted to move along a path which traces the periphery of the coil assembly. The linear motor also comprises sensors such as hall sensors, which can be positioned and spaced along the length of the linear motor. Each sensor is associated with a subset (one or more but not all) of the coil units. Each sensor is adapted to send or output a first sensor signal in response to detecting the magnet track.

The linear motor also comprises a control unit, the control unit configured to receive the first sensor signal (the signal that indicates that the magnet track has been detected), identify the sensor (amongst the plurality of sensors) which sent the first sensor signal, and power up the subset of the coil units associated with that sensor. The control unit can store the association between the sensors and their associated subset of coil units. This association can be based on the proximity from one another i.e. the sensor is positioned near or close to its associated subset of coil units.

In operation, a particular sensor detects the magnet track as it commutes along its path. The particular sensor sends the first sensor signal to the control unit. In response, the control unit powers up only the coil units associated with the particular sensor. The coil units associated with the particular sensor would typically be near or proximate to the particular sensor which therefore follows that only the coil units near or proximate to the current position of the magnet track will be powered up. These associated coil units can be the coil units which are "ahead" of the magnet track along its path. Therefore, the coil units are selectively powered up, and relative to the current position of the magnet track as it moves along its path. This is advantageous as the coil units which are not near to the current position of the magnet track will not be powered up which helps to mitigate the overall heat generation of the linear motor.

Furthermore, due to the selective nature of powering up the coil units, not all of the coil units are powered up together at any one time. Instead, only a subset of the coil units are powered up at any one time which again helps to reduce the overall heat generation of the linear motor.

In embodiments, the linear motor can further comprise thermo-electric cooling units. The thermo-electric cooling units are for cooling or removing heat from the coil units. Each sensor can be further associated with a subset (one or more but not all) of the thermo-electric cooling units. The control unit can be configured to receive the first sensor signal (the signal that indicates that the magnet track has been detected), identify the sensor (amongst the plurality of sensors) which sent the first sensor signal, and activate the subset of thermo-electric cooling units associated with that sensor. The control unit can store the association between the sensors and their associated subset of thermo-electric cooling units. This association can be based on the proximity from one another i.e. the sensor is positioned near or close to its associated subset of thermo-electric cooling units.

In operation, a particular sensor detects the magnet track as it commutes along its path. The particular sensor sends the first sensor signal to the control unit. In response, the control unit activates only the thermo-electric cooling units associated with the particular sensor. The thermo-electric cooling units associated with the particular sensor would typically be near or proximate to the particular sensor which therefore follows that only the thermo-electric cooling units near or proximate to the current position of the magnet track will be activated. These associated thermo-electric cooling units can be the thermo-electric cooling units which are "ahead" of the magnet track along its path. Therefore, the thermo-electric cooling units are selectively activated, and relative to the current position of the magnet track as it moves along its path. This is advantageous as the thermo-electric cooling units which are not near to the current position of the magnet track will not be activated which helps to mitigate the overall heat generation of the linear motor.

Furthermore, due to the selective nature of activating the thermo-electric cooling units, not all of the thermo-electric cooling units are activated together at any one time. Instead, only a subset of the thermo-electric cooling units are activated at any one time which again helps to reduce the overall heat generation of the linear motor.

Even further still, the subset of the thermo-electric cooling units that have been activated can be proximate to the subset of coil units that have been powered up. Therefore, the subset of the thermo-electric cooling units that have been activated can cool the subset of the coil units that have been powered up. This results in a synergistic effect in that portions of the coil assembly are "selectively powered-up" and "selectively cooled".

In embodiments, the sensors can be further adapted to send a second sensor signal in response to not detecting the magnet track. The control unit can be further configured to receive the second sensor signal (the signal that indicates that the magnet track can no longer be detected), identify the sensor which sent the second sensor signal, and depower the subset of the coil units associated with that sensor. Therefore, the associated coil units, which will typically be a distance from or not proximate to the current position of the magnet track will be depowered. These associated coil units can be the coil units which are "behind" the magnet track as the magnet track moves along its path. Therefore, the coil units are depowered relative to the sensors no longer detecting the magnet track.

In embodiments, the control unit can be further configured to receive the second sensor signal (the signal that indicates that the magnet track can no longer be detected), identify the sensor which sent the second sensor signal, and deactivate the subset of the thermo-electric cooling units associated with that sensor. Therefore, the associated thermo-electric cooling units, which will typically be a distance from or not proximate to the magnet track will be deactivated. These associated thermo-electric cooling units can be the thermo-electric cooling units which are "behind" the magnet track as the magnet track moves along its path. Therefore, the thermo-electric cooling units are deactivated relative to the sensors no longer detecting the magnet track.

In embodiments, a linear motor having the capability to selectively power-up and selectively cool portions of its coil assembly has been described. The efficiency of the linear motor is increased as the energy used at any one time is only for a subset of the coil units and for a subset of the thermo-electric cooling units. As such, embodiments of the inventions can achieve localized power-up or target cooling of the coil assembly, and can allow for a higher input current than its rating without causing the coil assembly to overheat.

FIG. 1 shows a perspective view of a linear motor in accordance with certain embodiments. Linear motor 100 can have magnet track 101 and coil assembly 102. Magnet track 101 can be configured to follow a path or a trajectory. The path or trajectory of magnet track 101 can follow or trace a periphery or an edge of coil assembly 102. When moving along the trajectory, magnet track 101 can be in close proximity to coil assembly 102, but does not directly contact coil assembly 102.

Coil assembly 102 can be made up of a plurality of coil units 103. Coil units 103 can be concatenated in a cascading arrangement as shown in FIG. 1. Each coil unit 103 can be formed by winding multiple turns of conducting wire into coil windings, and connecting each of the poly phase in either WYE or DELTA arrangement. For example, coil unit 103 can have a "U" coil winding, a "V" coil winding and a "W" coil winding. The coil windings can be encapsulated in a thermally conductive and yet highly electrically resistive medium or epoxy. Each coil unit 103 can be in a "powered" or "depowered" mode.

Figure 2:
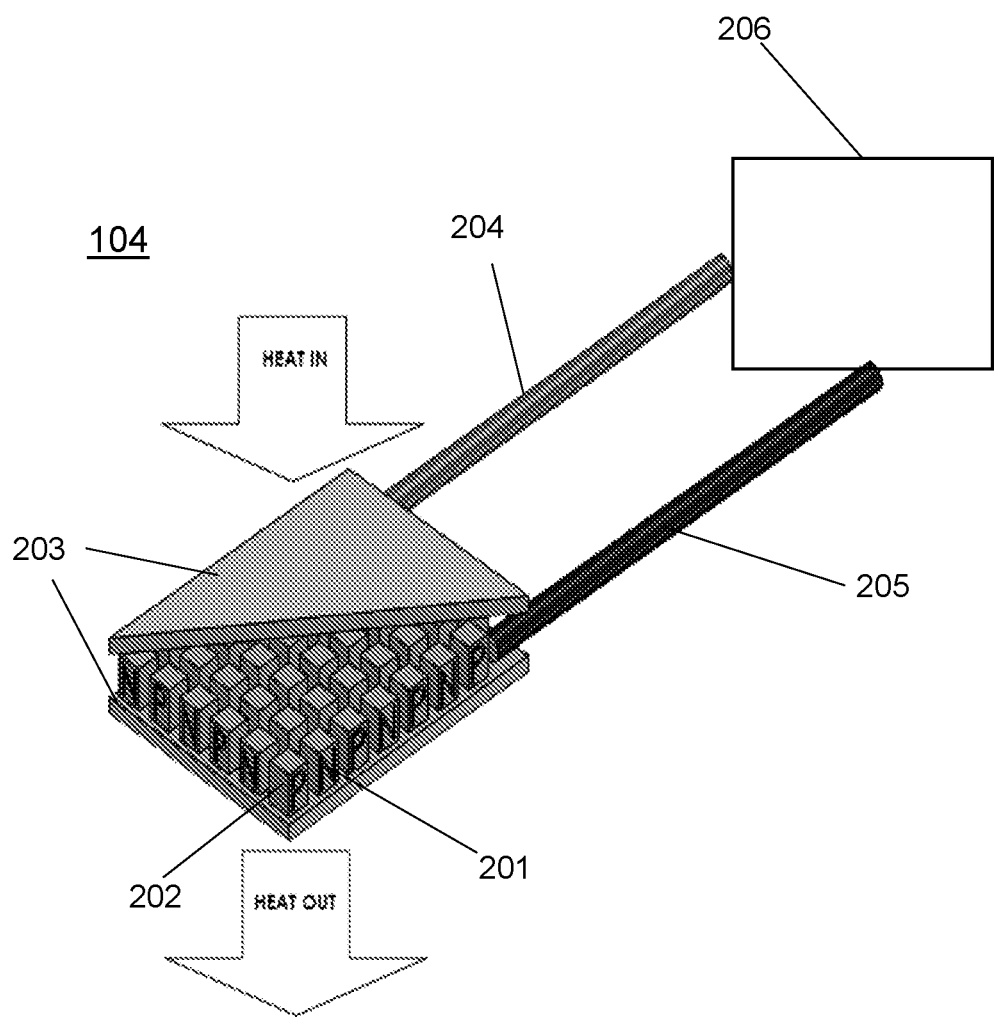
FIG. 2 shows an exemplary thermo-electric cooling unit.

Linear motor 100 can also comprise a plurality of thermo-electric cooling units 104. Thermo-electric cooling units 104 can be arranged in an array as depicted in FIG. 1. Thermo-electric cooling units 104 can be adapted to cool coil units 103. An exemplary thermo-electric cooling unit 104 is illustrated in FIG. 2. Thermo-electric cooling unit 104 can comprise multiple pairs of N semiconductor elements 201 and P semiconductor elements 202, each N-P pair forming a thermocouple. The N semiconductor elements 201 and P semiconductor elements 202 can be held between two temperature resistant ceramic substrates 203, and can be electrically connected to lead-out conductors 204, 205. Ceramic substrates 203 can serve to hold the overall structure together and also insulate the N semiconductor elements 201 and P semiconductor elements 202 from one another. Lead-out conductors 204, 205 can be connected to power source 206. The N semiconductor elements 201 can be doped such that it has an excess of electrons and the P semiconductor elements 202 can be doped to have a deficiency of electrons. To activate the thermo-electric cooling unit 104, power from power source 206 is supplied through lead-out conductors 204, 205, and the electrons move heat energy from one ceramic substrate 203 (which experiences heat removal) to the other ceramic substrate 203 (which experiences heat dissipation).

Figure 3:
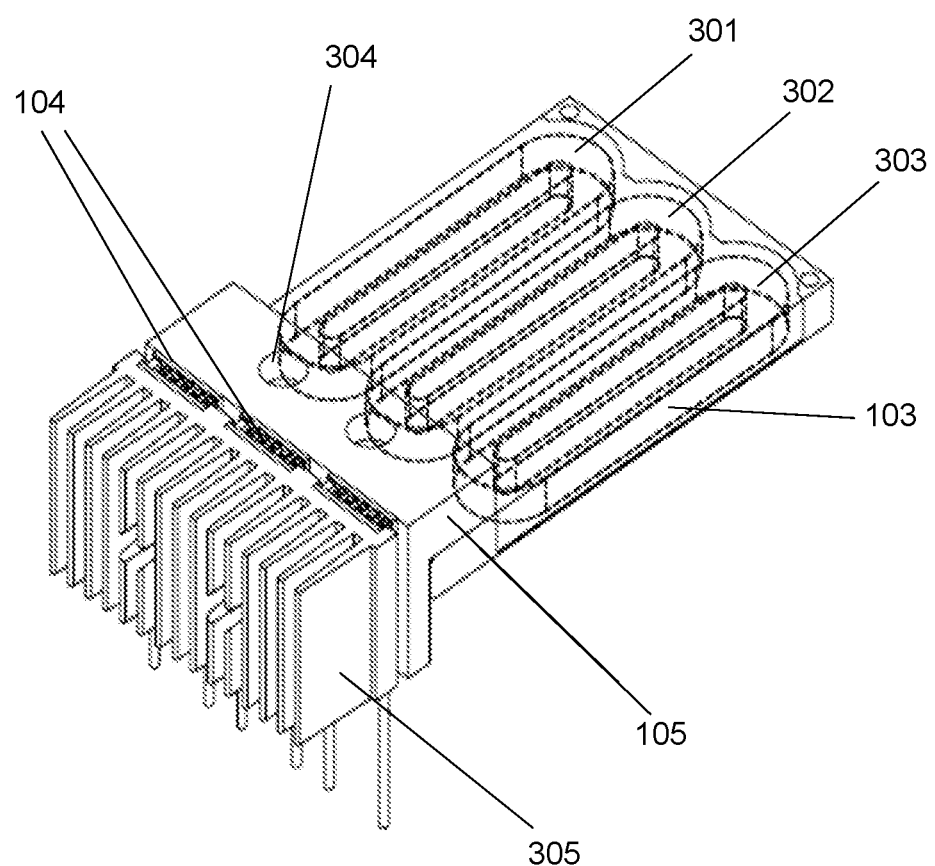
FIG. 3 shows a coil unit with a plurality of thermo-electric cooling units.

Thermo-electric cooling units 104 can be located adjacent (in contact or in close proximity) to coil units 103 (for example, see FIG. 1). There can be a thermo-electric cooling unit 104 designated for, and to cool each coil unit 103. Alternatively, there can be a thermo-electric cooling unit 104 designated for each coil winding in coil unit 103. For example, as illustrated in FIG. 3, coil unit 103 has "U" coil winding 301, "V" coil winding 302 and "W" coil winding 303, and each coil winding has a thermo-electric cooling unit 104 designated to it.

Thermo-electric cooling units 104 can be in an "activated" or a "de-activated" mode. When power is supplied to lead-out conductors 204, 205, thermo-electric cooling units 104 are activated, and begin actively removing heat from coil unit 103 (i.e. cool coil unit 103). When power is removed from lead-out conductors 204, 205, thermo-electric cooling units 104 switch to the deactivated mode.

In embodiments, linear motor 100 can also comprise coil assembly cap 105. Referring to FIG. 3, coil assembly cap 105 can be placed intermediate between coil units 103 and thermo-electric cooling units 104. Coil assembly cap 105 can be affixed to the base of coil units 103. Coil assembly cap 105 can serve as a conductive medium whereby heat from coil units 103 can be conducted out to thermo-electric cooling units 104. Coil assembly cap 105 can also serve as a mounting medium for attaching external mechanical parts, whereby attachment to coil assembly cap 105 can be via tap holes 304.

In embodiments, linear motor 100 can also comprise heat sink 305. Referring to FIG. 3, heat sink 305 can be located adjacent (in contact or in close proximity) to thermo-electric cooling units 104 such that heat flows from thermo-electric cooling units 104 to heat sink 305.

Linear motor 100 can also comprise a plurality of sensors 106 (see FIG. 1). Each sensor in the plurality of sensors 106 can be adapted to detect magnet track 101 at some point as it moves along its path or trajectory. Each sensor 106 can be adapted to send sensor signals in response to detecting and no longer detecting magnet track 101. For example, if a sensor 106 detects magnet track 101, the sensor 106 can send a first sensor signal (DETECT), and if the sensor 106 does not detect magnet track 101, the sensor 106 can send a second sensor signal (NO_DETECT). The plurality of sensors 106 can be positioned and spaced along the length of linear motor 100. The plurality of sensors 106 (such as hall sensors) can also be positioned and spaced along coil assembly cap 105 (for example, see FIG. 1). Non-exhaustive examples of sensors 106 can be hall sensors, optical sensors, infra-red sensors and the like.

In embodiments, each sensor in the plurality of sensors 106 can be associated with one or more coil units 103. This association can be attributed to the close proximity between the sensor 106 and the one or more coil units 103. For example, a sensor 106 can be associated with three coil units 103 as the physical location of the coil units 103 are near or proximate to the physical location of the sensor 106. In embodiments, multiple sensors 106 can also be associated with a single coil unit 103. This association can be attributed to the close proximity between the sensors 106 and the single coil unit 103. For example, two sensors 106 can be associated with a single coil unit 103 as the physical location of the two sensors 106 are near or proximate to the physical location of the single coil unit 103. The association between the plurality of sensors 106 and coil units 103 can be stored in an association table.

In embodiments, each sensor in the plurality of sensors 106 can be associated with one or more thermo-electric cooling units 104. This association can be attributed to the close proximity between the sensor 106 and the one or more thermo-electric cooling units 104. For example, a sensor 106 can be associated with three thermo-electric cooling units 104 as the physical location of the three thermo-electric cooling units 104 are near or proximate to the physical location of the sensor 106. In embodiments, multiple sensors 106 can also be associated with a single thermo-electric cooling unit 104. This association can be attributed to the close proximity between the sensors 106 and the single thermo-electric cooling unit 104. For example, two sensors 106 can be associated with a single thermo-electric cooling unit 104 as the physical location of the two sensors 106 are near to or proximate the physical location of the single thermo-electric cooling unit 104. The association between the plurality of sensors 106 and thermo-electric cooling units 104 can be stored in the association table.

In embodiments, linear motor 100 can comprise a control unit. The control unit can be adapted to receive the sensor signals sent from the sensors 106. The control unit can be adapted to identify the sensor 106 which sent the sensor signal. If the identified sensor 106 has sent a first sensor signal (DETECT), the control unit can be configured to power-up the coil unit(s) 103 associated with the identified sensor 106 and/or activate the thermo-electric cooling unit(s) 104 associated with the identified sensor 106.

If the identified sensor 106 has sent a second sensor signal (NO_DETECT), the control unit can be configured to depower the coil unit(s) 103 associated with the identified sensor 106 and/or deactivate the thermo-electric cooling unit(s) 104 associated with the identified sensor 106.

In embodiments, the control unit can comprise switching control means for powering/depowering the coil unit(s) 103 associated with the identified sensor 106, and activating/deactivating the thermo-electric cooling unit(s) 104 associated with the identified sensor 106. In embodiments, the control unit can be configured to reference the association table to ascertain the coil unit(s) 103 and the thermo-electric cooling unit(s) 104 associated with the identified sensor 106.

Figure 4A:
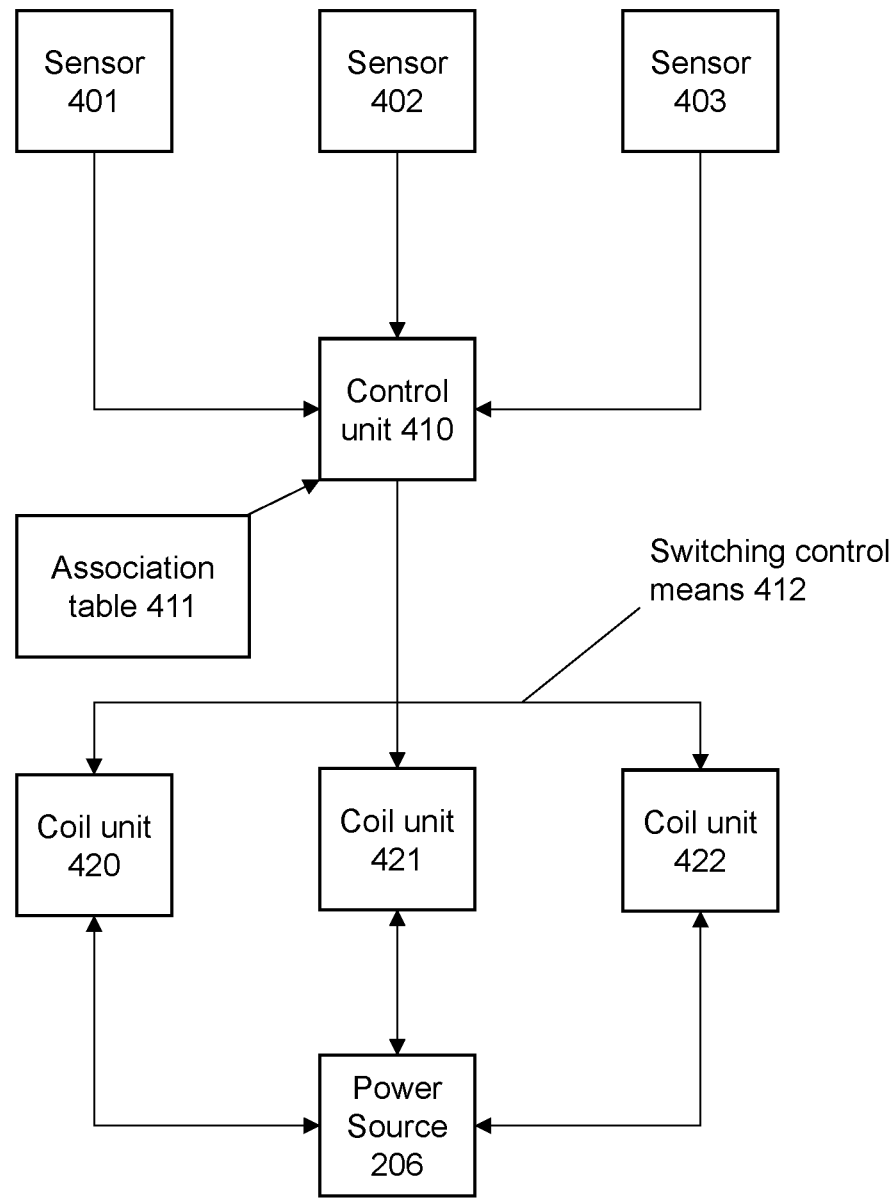
FIG. 4a shows a schematic diagram depicting the connections between a control unit and coil units.

Referring to FIG. 4a, sensors 401, 402, 403 of plurality of sensors 106 are operationally connected to control unit 410. Sensors 401, 402, 403 can be positioned and spaced along the length of linear motor 100. Sensors 401, 402, 403 are adapted to send sensor signals to control unit 410. Control unit 410 is adapted to identify which sensor 401, 402, 403 sent the sensor signal. Control unit 410 references association table 411 to ascertain which of the coil units 420, 421, 422 is/are associated with the identified sensor (401, 402, 403). Control unit 410 can use switching control means 412 to selectively power-up coil units 420, 421, 422, which will draw power from power source 206. Control unit 410 can also use switching control means 412 to selectively depower coil units 420, 421, 422, wherein coil units 420, 421, 422 stop drawing power from power source 206.

Figure 4B:
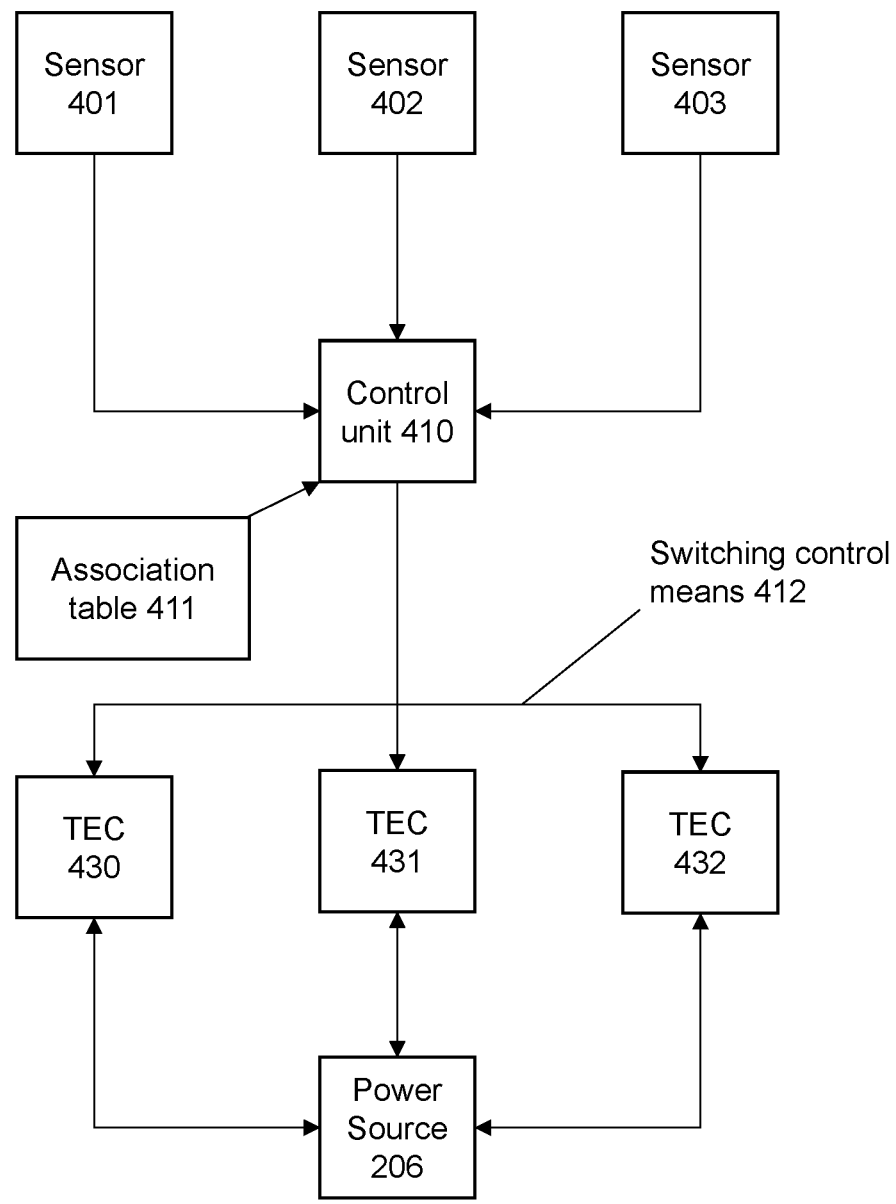
FIG. 4b shows a schematic diagram depicting the connections between a control unit and thermo-electric cooling units.

Referring to FIG. 4b, in a similar fashion to what had been described for FIG. 4a, control unit 410 references association table 411 to ascertain which of the thermo-electric cooling units (TECs) 430, 431, 432 is/are associated with the identified sensor (401, 402, 403). Control unit 410 can use switching control means 412 to selectively activate TECS 430, 431, 432, which will draw power from power source 206. Control unit 410 can also use switching control means 412 to selectively deactivate TECS 430, 431, 432, wherein TECS 430, 431, 432 stop drawing power from power source 206.

Figure 5:
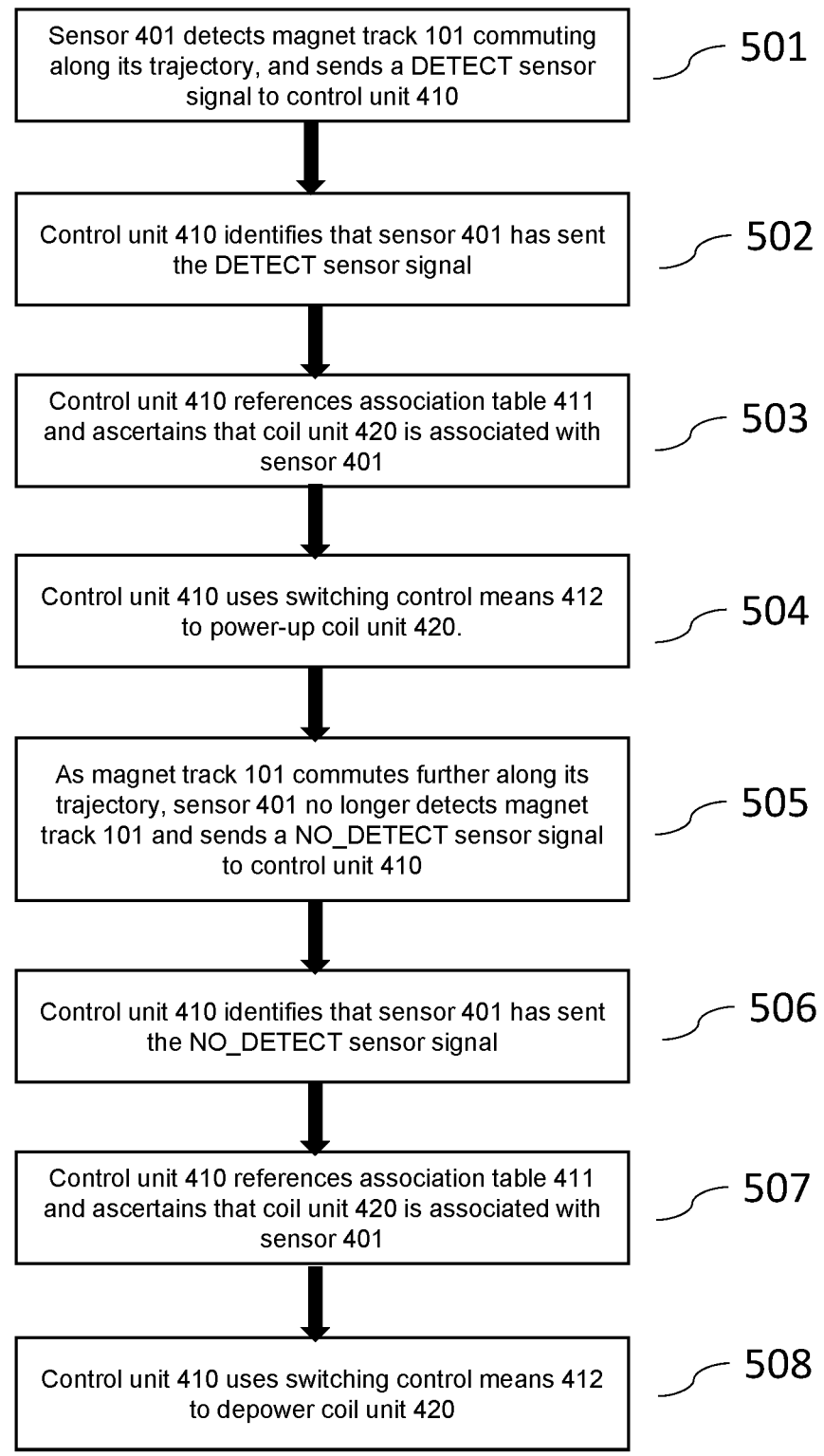
FIG. 5 shows a flowchart which outlines a method for selectively powering-up portions of a coil assembly of a linear motor, in accordance with certain embodiments.

FIG. 5 depicts a flowchart which outlines a method for selectively powering-up portions of a coil assembly of a linear motor, in accordance with certain embodiments. In step 501, sensor 401 detects magnet track 101 commuting along its trajectory, and sends the first sensor signal (DETECT) to control unit 410.

In step 502, control unit 410 identifies that sensor 401 has sent the first sensor signal (DETECT). In step 503, control unit 410 references association table 411 and ascertains that coil unit 420 is associated with sensor 401. In step 504, control unit 410 uses switching control means 412 to power-up coil unit 420.

In step 505, as magnet track 101 commutes further along its trajectory, sensor 401 no longer detects magnet track 101 and sends the second sensor signal (NO_DETECT) to control unit 410.

In step 506, control unit 410 identifies that sensor 401 has sent the second sensor signal (NO_DETECT). In step 507, control unit 410 references association table 411 and ascertains that coil unit 420 is associated with sensor 401. In step 508, control unit 410 uses switching control means 412 to depower coil unit 420. Although a single sensor 401 to a single coil unit 420 ratio has been described in FIG. 5, it will be obvious to a skilled person that variations are possible, and a single sensor 401 can be associated with multiple coil units or that multiple sensors can be associated with a single coil unit 420.

Figure 6:
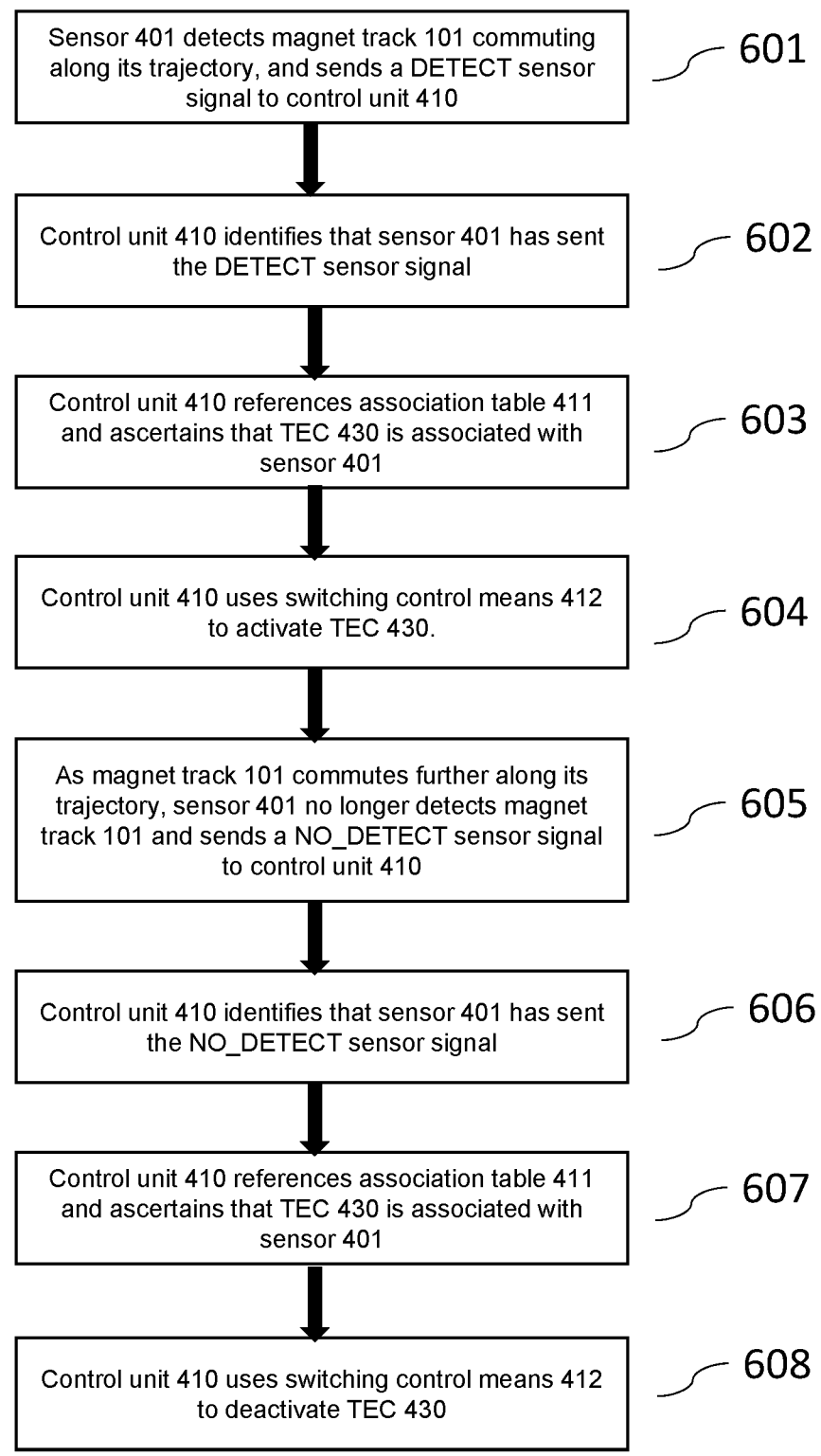
FIG. 6 shows a flowchart which outlines a method for selectively cooling portions of a coil assembly of a linear motor, in accordance with certain embodiments.

FIG. 6 depicts a flowchart which outlines a method for selectively cooling portions of a coil assembly of a linear motor, in accordance with certain embodiments. In step 601, sensor 401 detects magnet track 101 commuting along its trajectory, and sends the first sensor signal (DETECT) to control unit 410.

In step 602, control unit 410 identifies that sensor 401 has sent the first sensor signal (DETECT). In step 603, control unit 410 references association table 411 and ascertains that thermo-electric cooling unit (TEC) 430 is associated with sensor 401. In step 604, control unit 410 uses switching control means 412 to activate TEC 430.

In step 605, as magnet track 101 commutes further along its trajectory, sensor 401 no longer detects magnet track 101 and sends the second sensor signal (NO_DETECT) to control unit 410.

In step 606, control unit 410 identifies that sensor 401 has sent the second sensor signal (NO_DETECT). In step 607, control unit 410 references association table 411 and ascertains that TEC 430 is associated with sensor 401. In step 608, control unit 410 uses switching control means 412 to deactivate TEC 430. Although a single sensor 401 to a single TEC 430 ratio has been described in FIG. 6, it will be obvious to a skilled person that variations are possible, and a single sensor 401 can be associated with multiple TECs or that multiple sensors can be associated with a single TEC 430.

Figure 7:
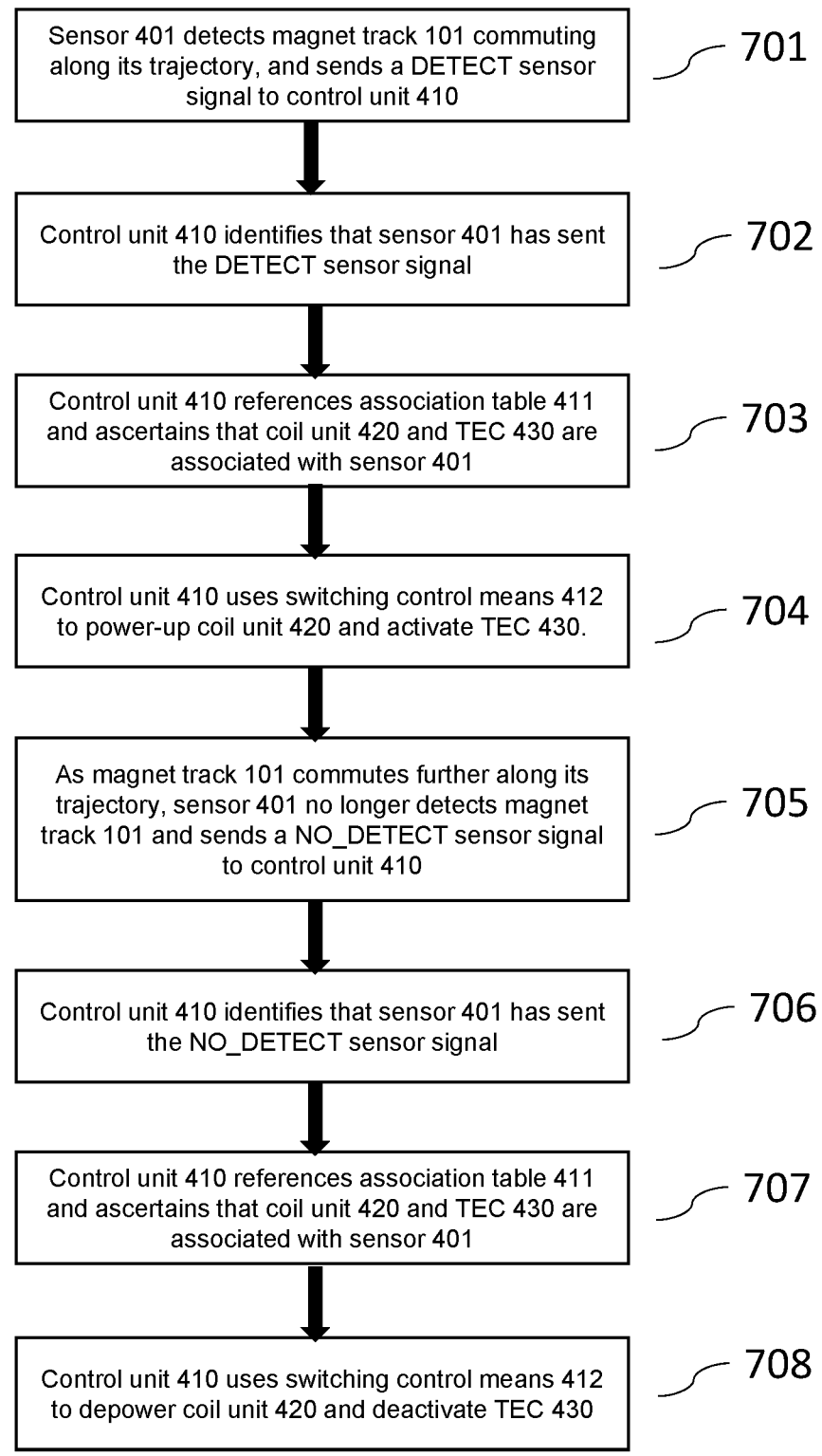
FIG. 7 depicts a flowchart which outlines a method for selectively powering-up and selectively cooling portions of a coil assembly of a linear motor, in accordance with certain embodiments.

FIG. 7 depicts a flowchart which outlines a method for selectively powering-up and selectively cooling portions of a coil assembly of a linear motor, in accordance with certain embodiments. In step 701, sensor 401 detects magnet track 101 commuting along its trajectory, and sends the first sensor signal (DETECT) to control unit 410.

In step 702, control unit 410 identifies that sensor 401 has sent the first sensor signal (DETECT). In step 703, control unit 410 references association table 411 and ascertains that coil unit 420 and thermo-electric cooling unit (TEC) 430 are associated with sensor 401. In step 704, control unit 410 uses switching control means 412 to power-up coil unit 420 and activate TEC 430.

In step 705, as magnet track 101 commutes further along its trajectory, sensor 401 no longer detects magnet track 101 and sends the second sensor signal (NO_DETECT) to control unit 410.

In step 706, control unit 410 identifies that sensor 401 has sent the second sensor signal (NO_DETECT). In step 707, control unit 410 references association table 411 and ascertains that coil unit 420 and TEC 430 are associated with sensor 401. In step 708, control unit 410 uses switching control means 412 to depower coil unit 420 and deactivate TEC 430.

Figure 8:
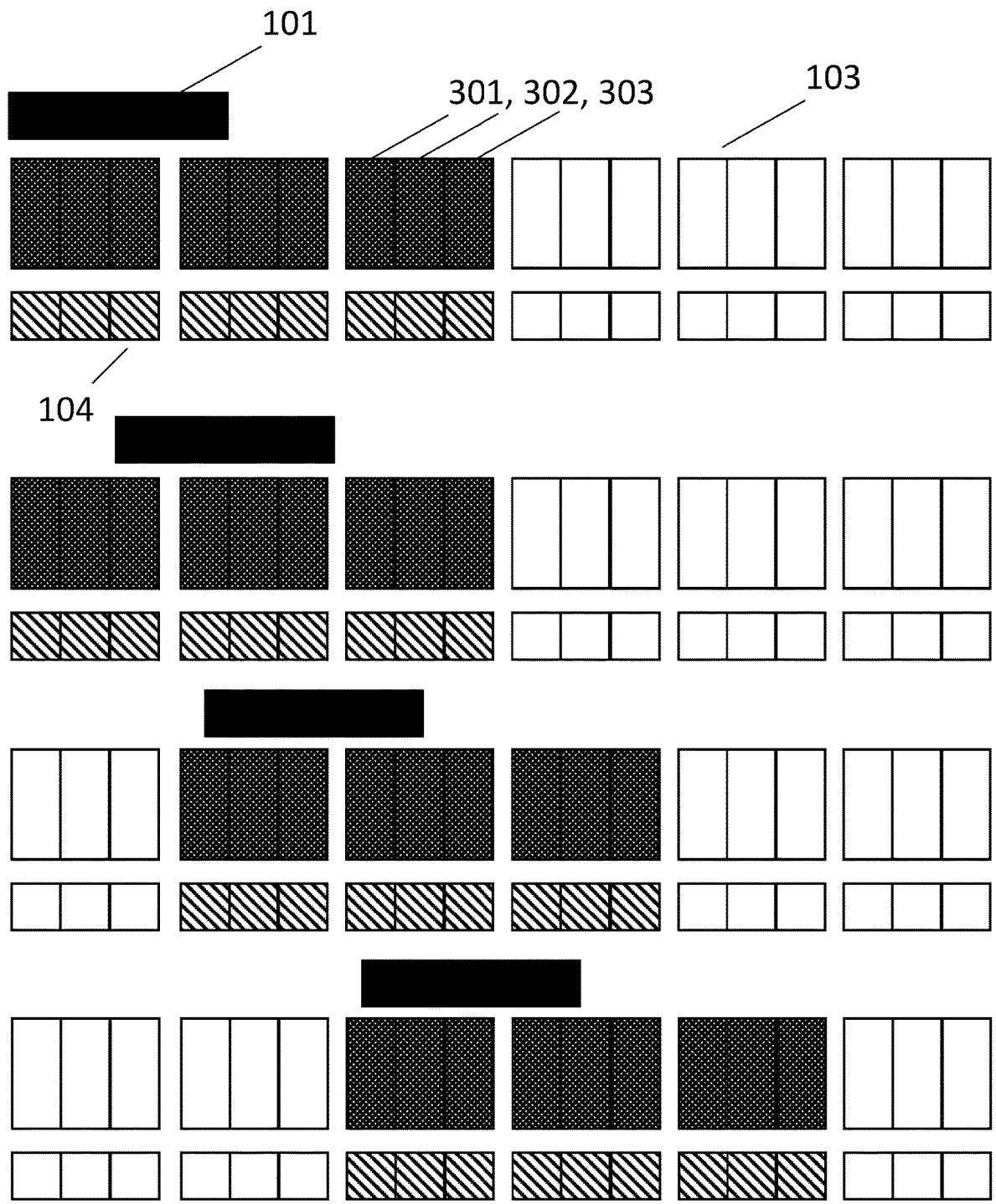
FIG. 8 shows a time step illustration as magnet track commutes along its path and proximate to an array of coil units, in accordance with certain embodiments.

FIG. 8 show the time step illustration as magnet track 101 commutes along its trajectory and proximate to an array of coil units 103 (coil assembly 102), in accordance with certain embodiments. Each coil unit 103 is sectioned into its 3 coil windings 301, 302, 303. An array of thermo-electric cooling units 104 are adjacent to the array of coil units 103. Each coil winding 301, 302, 303 has a dedicated thermo-electric cooling unit 104. Coil units 103 are powered-up/depowered and thermo-electric cooling units 104 are activated/deactivated in accordance with the disclosed embodiments.

As shown in FIG. 8, as magnet track 101 commutes along its trajectory, three coil units 103 are powered-up (depicted as shaded), and nine thermo-electric cooling units 104 are activated (depicted as shaded) to cool the respective three coil units 103, in accordance with the disclosed embodiments.

Figure 9:
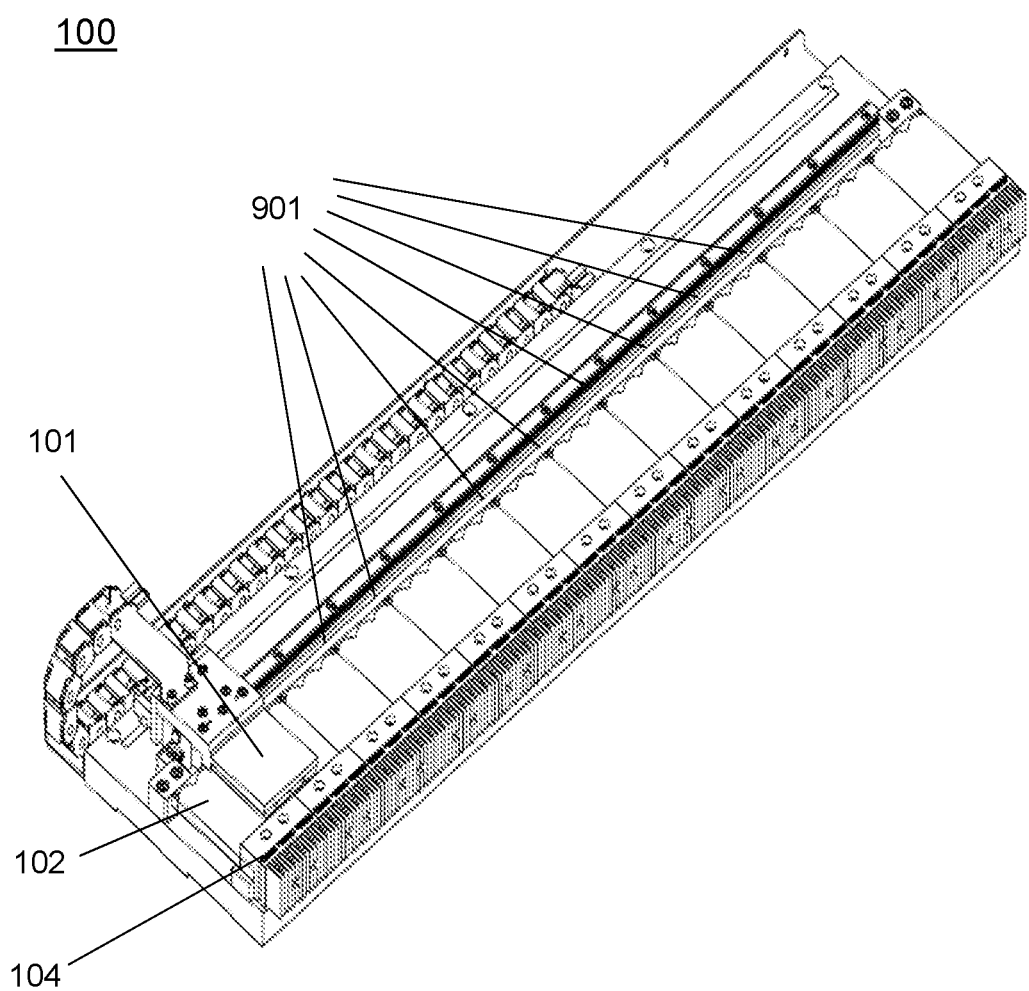
FIG. 9 shows an illustrative example of the positioning of optical sensors on a linear motor, in accordance with certain embodiments.

FIG. 9 shows an illustrative example of the positioning of optical sensors 901 on linear motor 100, in accordance with certain embodiments.

Figure 10:
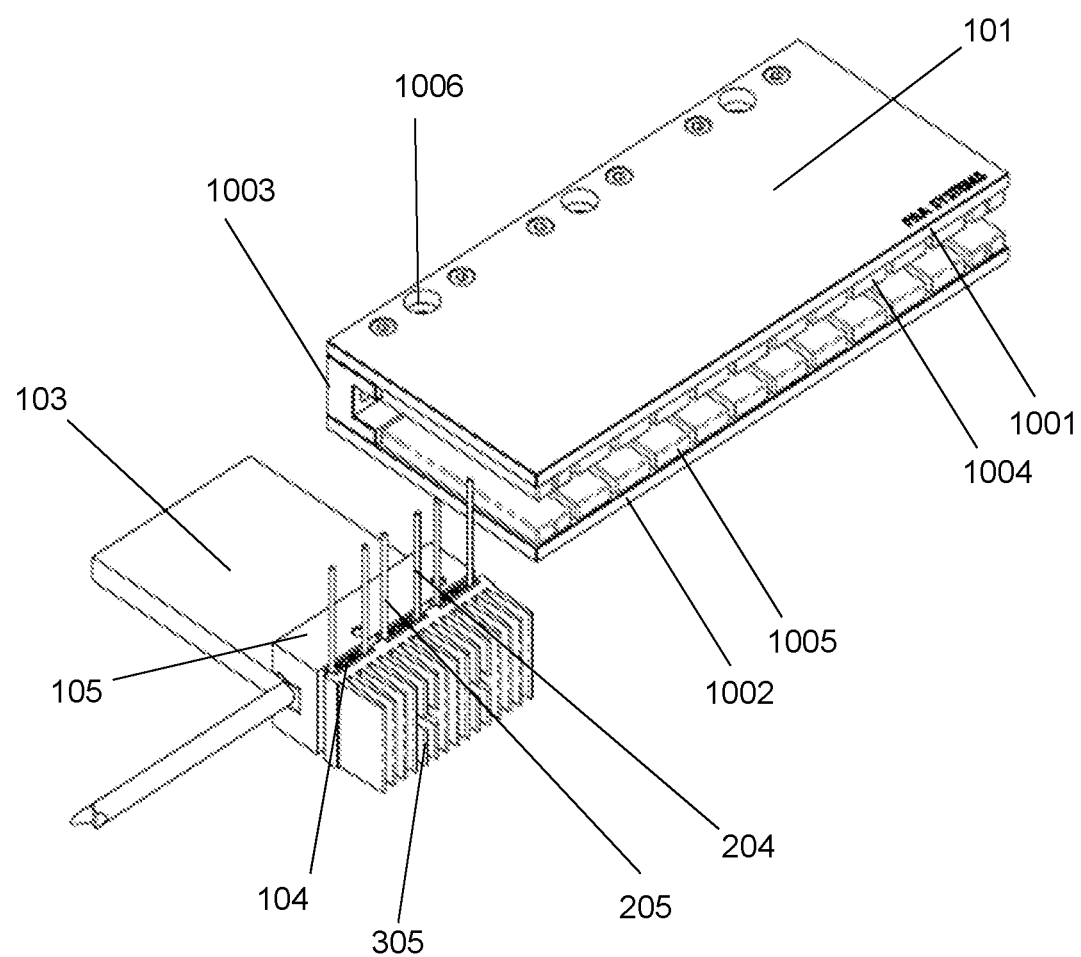
FIG. 10 shows a magnet track side by side with a coil unit, in accordance with certain embodiments Skilled artisans will appreciate that elements in the figures are illustrated for simplicity and clarity and have not necessarily been depicted to scale. For example, the dimensions of some of the elements in the block diagrams or steps in the flowcharts may be exaggerated in respect to other elements to help improve understanding of the present embodiment.

FIG. 10 shows magnet track 101 side by side with coil unit 103. Magnet track 101 can comprise two longitudinal ferromagnetic plates 1001, 1002, linked by a shorter base plate 1003. Magnet track 101 can have a U-shaped cross-section. Each ferromagnetic plate 1001, 1002 can have an array of periodic alternating permanent magnets 1004, 1005. Ferromagnetic plates 1001, 1002 and base plate 1003 can also have mounting holes 1006.

Unless specifically stated otherwise, and as apparent from the following, it will be appreciated that throughout the present specification, discussions utilizing terms such as "processing", "transferring", "loading", "storing", "executing" "scanning", "calculating", "determining", "replacing", "generating", "initializing", "outputting", or the like, refer to the action and processes of a computer system, or similar electronic device, that manipulates and transforms data represented as physical quantities within the computer system into other data similarly represented as physical quantities within the computer system or other information storage, transmission or display devices.

In the application, unless specified otherwise, the terms "comprising", "comprise", and grammatical variants thereof, intended to represent "open" or "inclusive" language such that they include recited elements but also permit inclusion of additional, non-explicitly recited elements.

It will be apparent that various other modifications and adaptations of the application will be apparent to the person skilled in the art after reading the foregoing disclosure without departing from the spirit and scope of the application and it is intended that all such modifications and adaptations come within the scope of the appended claims.

The invention claimed is:

1. A linear motor comprising:
    a longitudinal coil assembly comprising a plurality of coil units arranged in a cascading manner;
    a magnet track spaced from the coil assembly, and adapted to move along a path which traces a periphery of the coil assembly;
    a plurality of thermo-electric cooling units, each of the plurality of thermo-electric cooling units comprising multiple pairs of N semiconductor elements and P semiconductor elements held between a first substrate and a second substrate;
    a plurality of sensors, each sensor in the plurality of sensors being associated with a subset of the plurality of coil units and a subset of the plurality of thermo-electric cooling units, and adapted to send a first sensor signal in response to detecting the magnet track;
    a control unit, wherein the control unit is configured to:
    receive the first sensor signal;
    identify a sensor in the plurality of sensors, the sensor having sent the first sensor signal;
    reference an association table, the association table storing the association of the sensor, with the subset of the plurality of coil units and the subset of the plurality of thermo-electric cooling units; and
    power up the subset of the plurality of coil units associated with the sensor and activate the subset of the plurality of thermo-electric cooling units associated with the sensor, wherein the activation of the subset of the plurality of thermo-electric cooling units is performed by supplying power from a power source to the subset of the plurality of thermo-electric cooling units.

2. The linear motor of claim 1, wherein the subset of the plurality of thermo-electric cooling units associated with the sensor are positioned adjacent to, and are adapted to cool the subset of the plurality of coil units associated with the sensor.

3. The linear motor of claim 1, wherein the subset of the plurality of coil units associated with the sensor comprises a "U" coil winding, a "V" coil winding and a "W" coil winding, and wherein the subset of the plurality of thermo-electric cooling units associated with the sensor are adapted to cool the "U" coil winding, the "V" coil winding, and the "W" coil winding.

4. The linear motor of claim 1, wherein each sensor in the plurality of sensors is further adapted to send a second sensor signal in response to not detecting the magnet track, and wherein the control unit is further configured to receive the second sensor signal from the sensor and depower the subset of the plurality of coil units associated with the sensor.

5. The linear motor of claim 3, wherein the control unit is further configured to receive the second sensor signal from the sensor and deactivate the subset of the plurality of thermo-electric cooling units associated with the sensor.

6. The linear motor of claim 1, wherein the plurality of sensors comprises hall sensors adapted to detect a magnetic field of the magnet track or optical sensors adapted to detect a position of the magnet track.

7. The linear motor of claim 1, further comprising a coil assembly cap, and wherein the plurality of thermo-electric cooling units are embedded in the coil assembly cap.

8. The linear motor of claim 1, further comprising a heat sink positioned adjacent to the plurality of thermo-electric cooling units.

* * * * *